United States Patent
Lenart et al.

(10) Patent No.: US 11,114,593 B2
(45) Date of Patent: Sep. 7, 2021

(54) OPTOELECTRONIC MODULES AND OPTOELECTRONIC MOLDING TOOLS AND PROCESSES FOR MANUFACTURING THE SAME

(71) Applicant: ams Sensors Singapore Pte. Ltd., Singapore (SG)

(72) Inventors: Robert Lenart, Zurich (CH); Sonja Gantner, Lachen (CH); Oezkan Ahishali, Türkische Staatsbürger (TR)

(73) Assignee: ams Sensors Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/461,982

(22) PCT Filed: Nov. 30, 2017

(86) PCT No.: PCT/SG2017/050590
§ 371 (c)(1),
(2) Date: May 17, 2019

(87) PCT Pub. No.: WO2018/101889
PCT Pub. Date: Jun. 7, 2018

(65) Prior Publication Data
US 2019/0288166 A1    Sep. 19, 2019

Related U.S. Application Data

(60) Provisional application No. 62/428,639, filed on Dec. 1, 2016.

(51) Int. Cl.
*H01L 33/54* (2010.01)
*H01L 31/0203* (2014.01)
(Continued)

(52) U.S. Cl.
CPC .............. *H01L 33/54* (2013.01); *H01L 27/14* (2013.01); *H01L 31/0203* (2013.01);
(Continued)

(58) Field of Classification Search
CPC ............. H01L 27/14687; H01L 23/315; H01L 51/5237; H01L 33/54; H01L 33/58; H01L 31/0203; H01L 31/02327; H01L 31/02162
See application file for complete search history.

(56) References Cited

U.S. PATENT DOCUMENTS 7,087,945 B2 * 8/2006 Nakai ............... H01L 27/14625
257/288
2005/0195882 A1    9/2005 Wang et al.
(Continued)

FOREIGN PATENT DOCUMENTS

| CN | 101388426 A | 3/2009 |
|----|-------------|--------|
| CN | 101587923 A | 11/2009 |
| WO | 2015/076750 | 5/2015 |

OTHER PUBLICATIONS

ISA/SG, International Search Report for PCT/SG2017/050590 (dated Mar. 2, 2018).

*Primary Examiner* — Cuong Q Nguyen
*Assistant Examiner* — Peter M Albrecht
(74) *Attorney, Agent, or Firm* — Michael Best and Friedrich LLP

(57) ABSTRACT

This disclosure describes optoelectronic modules, methods for manufacturing pluralities of discrete optoelectronic modules, and optoelectronic molding tools. The methods include coating a substrate wafer and a plurality of optoelectronic components with a photosensitive material, and further include exposing select portions of the photosensitive material to electromagnetic radiation. The exposed portions delineate at least in part the dimensions of the optical channels, wherein the optical channels are associated with at
(Continued)

least one optoelectronic component. In some instances, optical elements are incorporated into the optical channels. In some instances, the exposed portions are the optical channels. In some instances, the exposed portions are spacers between the optical channels.

13 Claims, 11 Drawing Sheets

(51) Int. Cl.
    *H01L 31/0232* (2014.01)
    *H01L 31/12* (2006.01)
    *H01L 31/18* (2006.01)
    *H01L 33/00* (2010.01)
    *H01L 33/58* (2010.01)
    *H01L 27/14* (2006.01)
    *H01L 33/48* (2010.01)

(52) U.S. Cl.
    CPC .......... *H01L 31/0232* (2013.01); *H01L 31/12* (2013.01); *H01L 31/1876* (2013.01); *H01L 33/0095* (2013.01); *H01L 33/48* (2013.01); *H01L 33/58* (2013.01); *H01L 2933/005* (2013.01); *H01L 2933/0033* (2013.01)

(56) References Cited

U.S. PATENT DOCUMENTS

2007/0243662 A1   10/2007   Johnson et al.
2014/0183585 A1    7/2014   Gubser et al.
2016/0218239 A1    7/2016   Gubser et al.

* cited by examiner

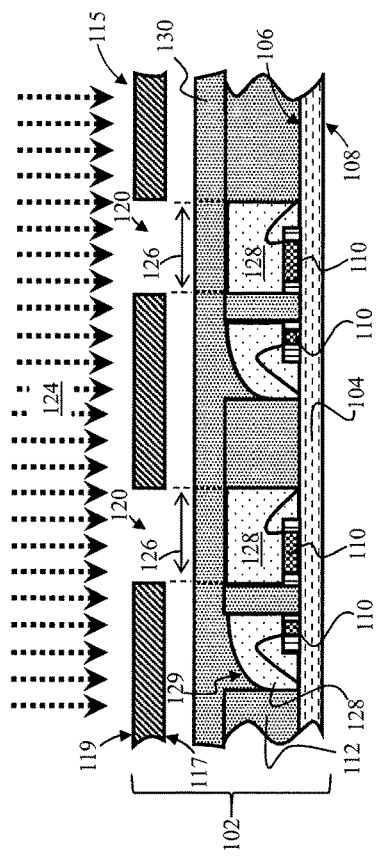
FIG. 1A
FIG. 1B
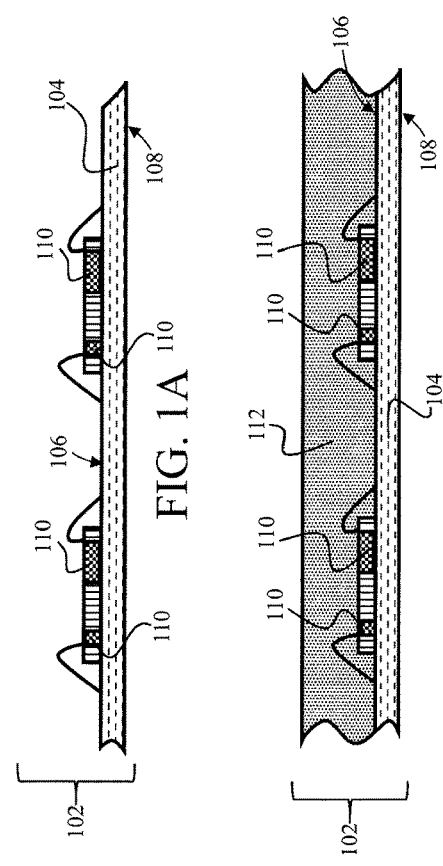
FIG. 1C
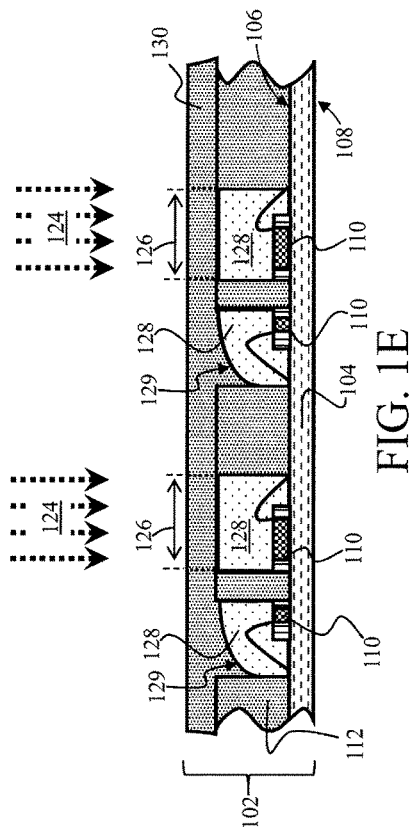
FIG. 1D
FIG. 1E

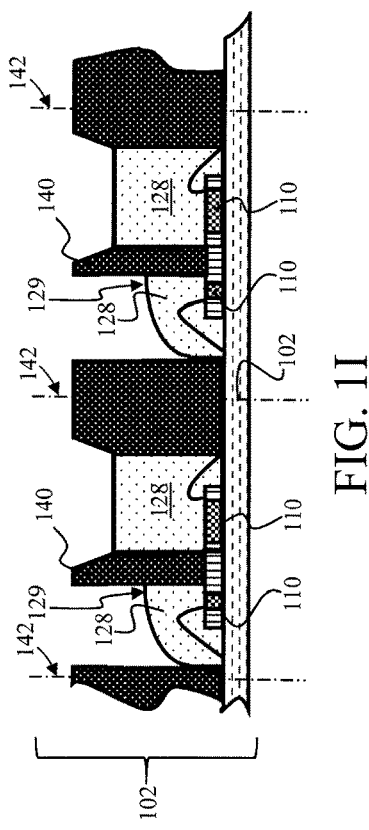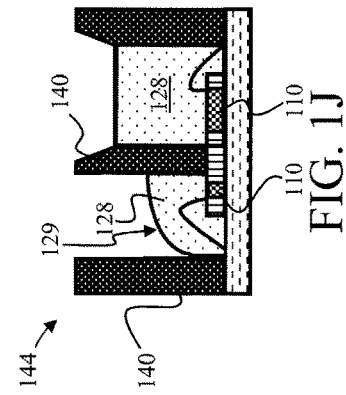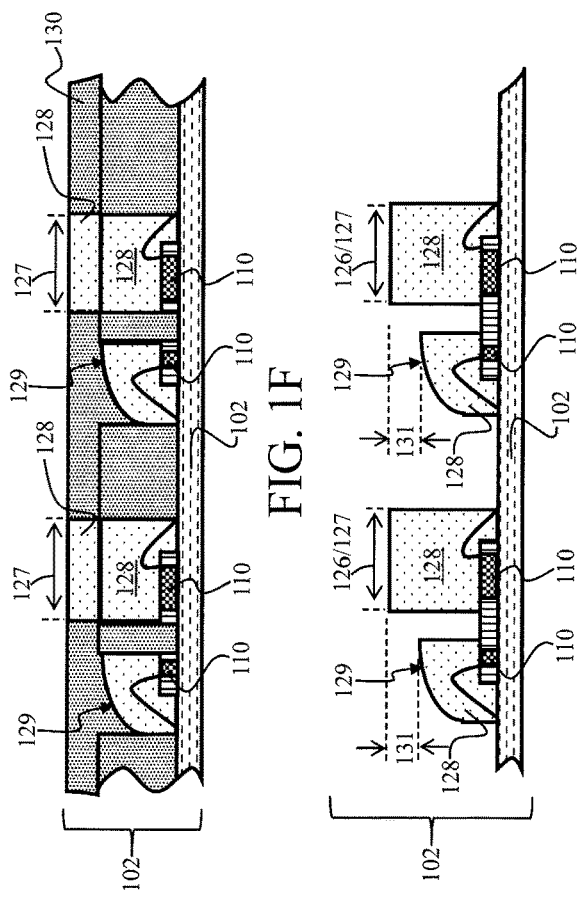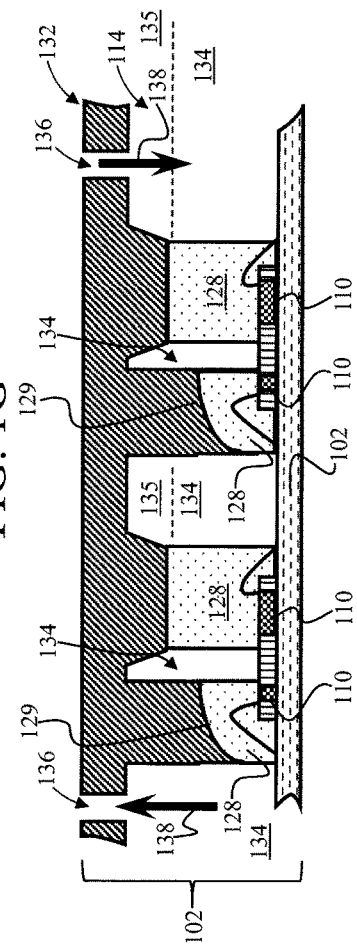
FIG. 1F
FIG. 1G
FIG. 1H
FIG. 1I
FIG. 1J

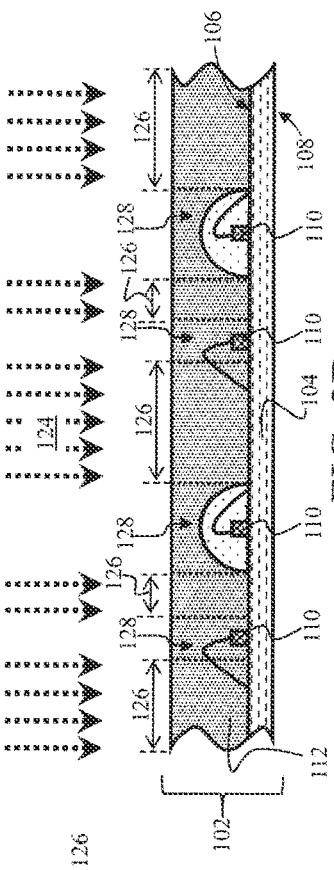
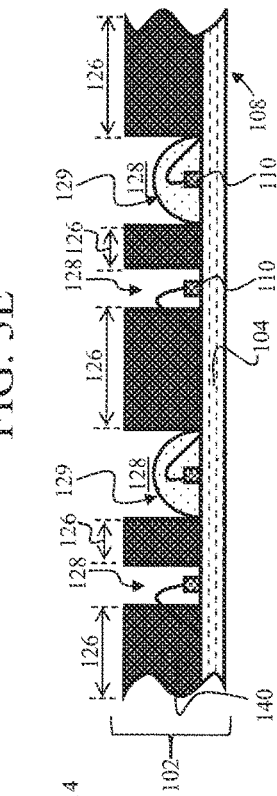
FIG. 3A
FIG. 3D
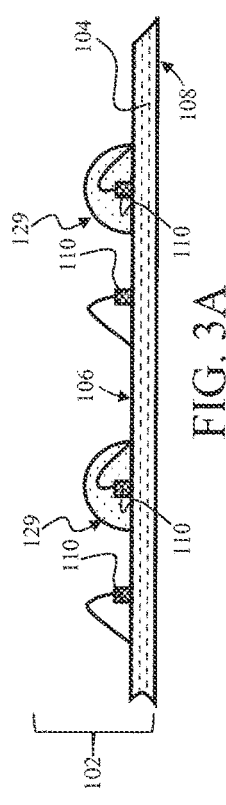
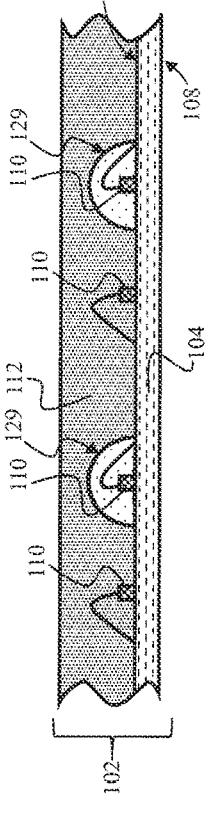
FIG. 3B
FIG. 3E
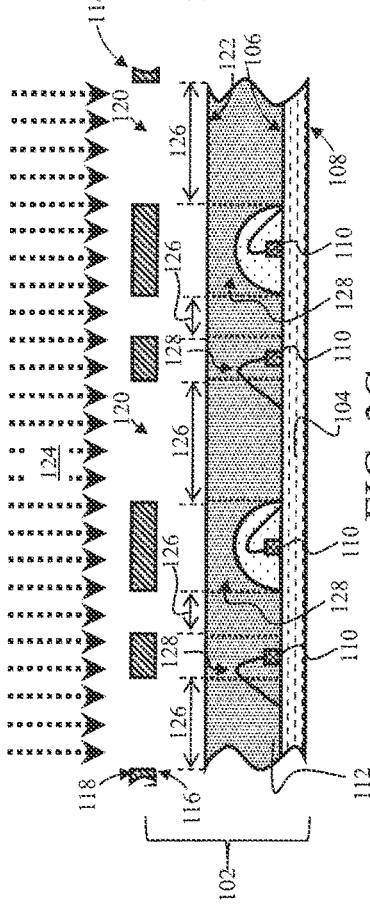
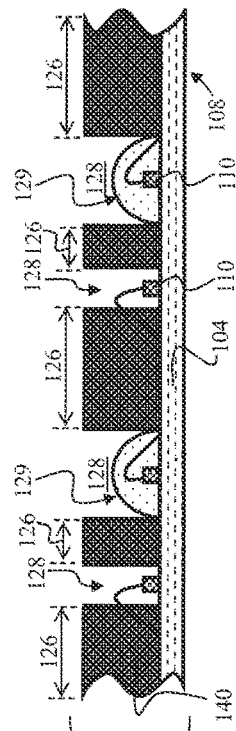
FIG. 3C
FIG. 3F

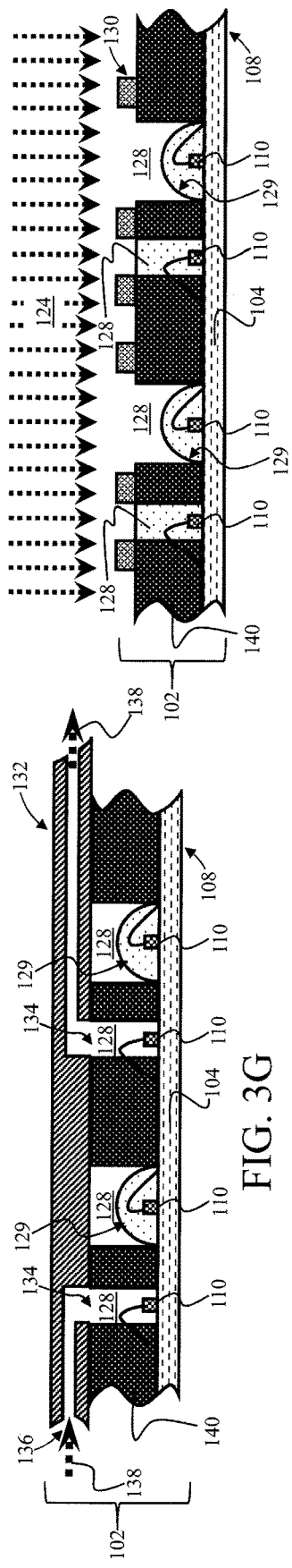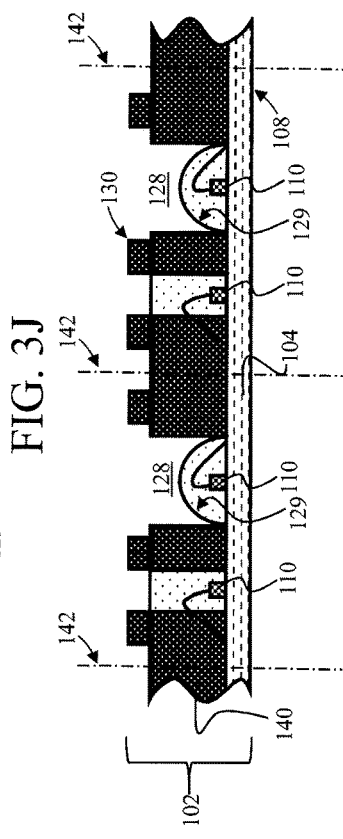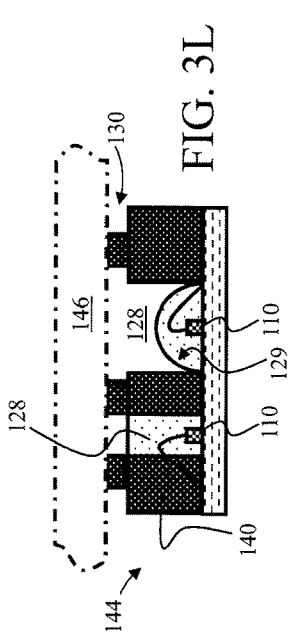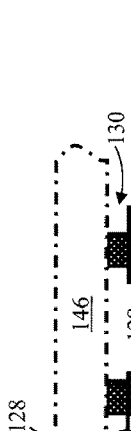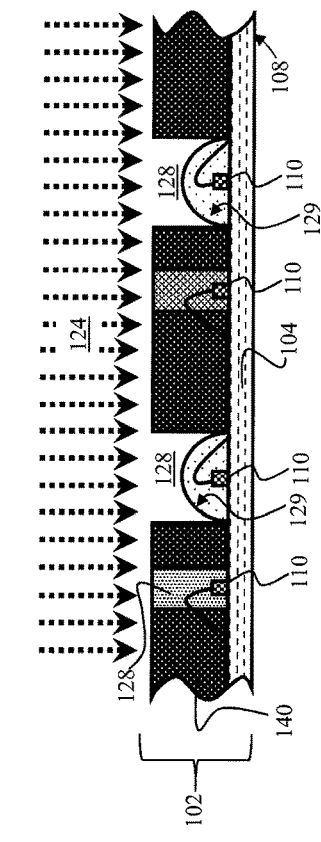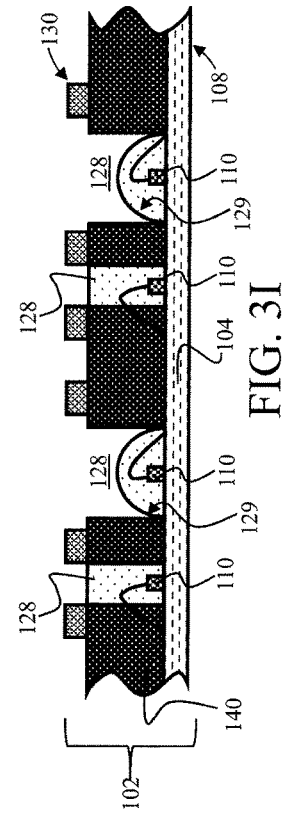
FIG. 3G
FIG. 3H
FIG. 3I
FIG. 3J
FIG. 3K
FIG. 3L

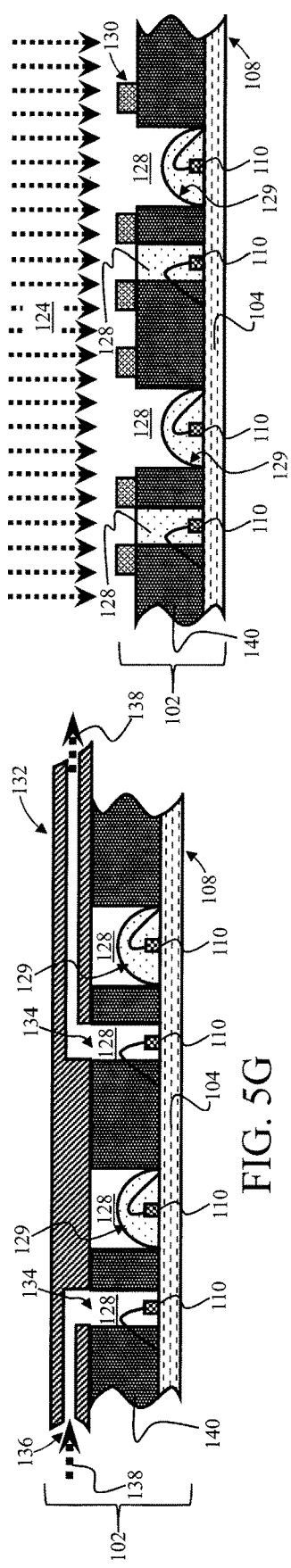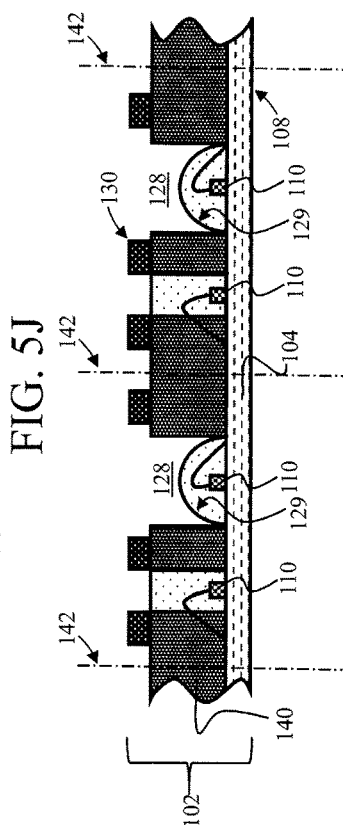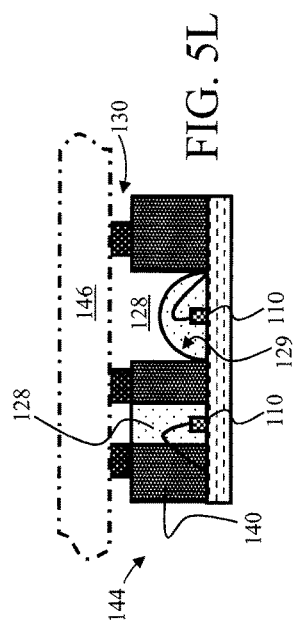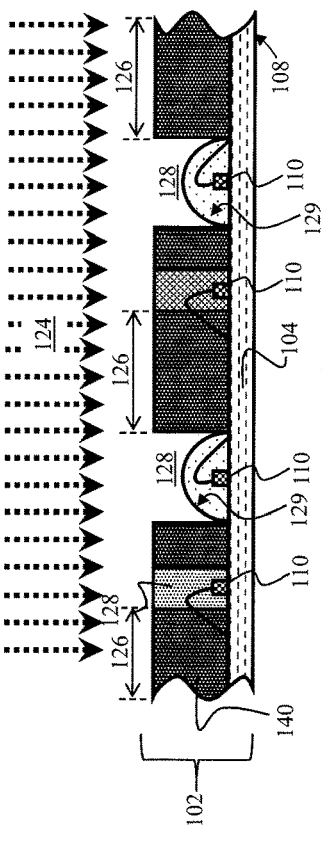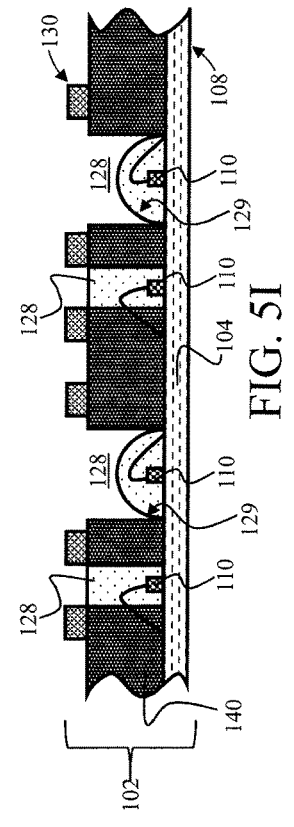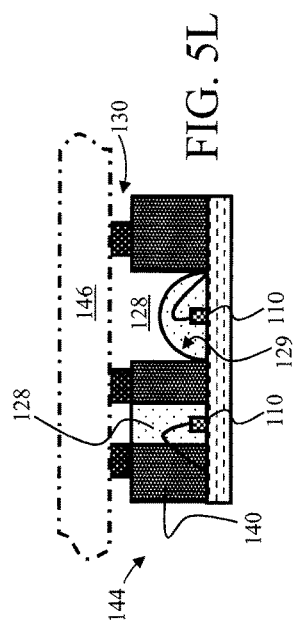

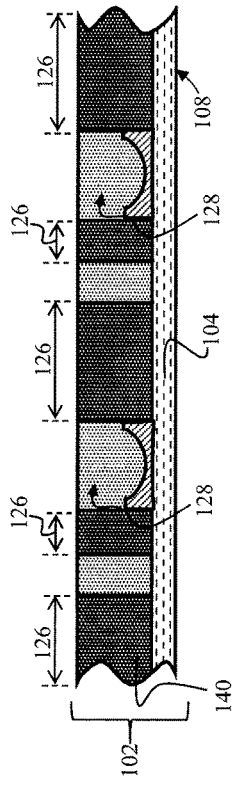
FIG. 7A
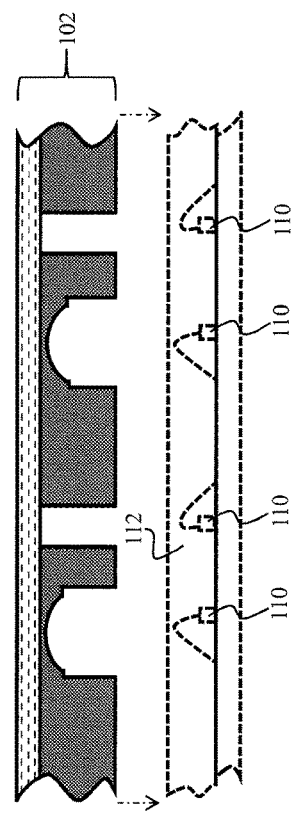
FIG. 7B
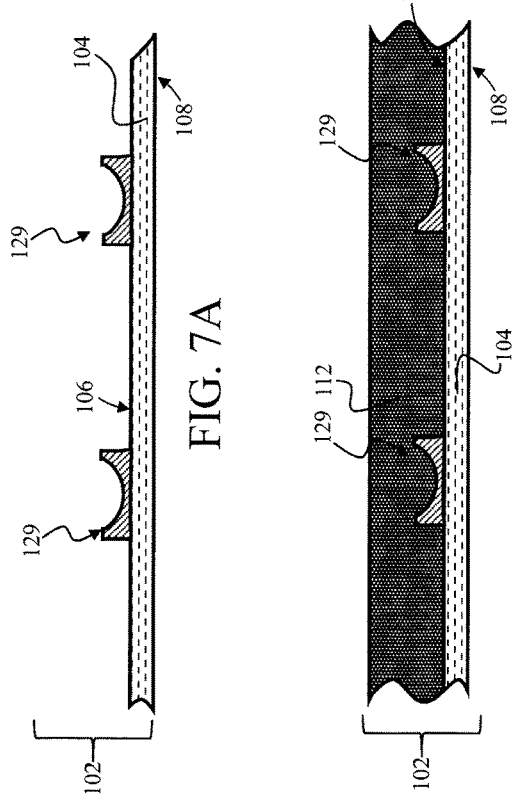
FIG. 7C
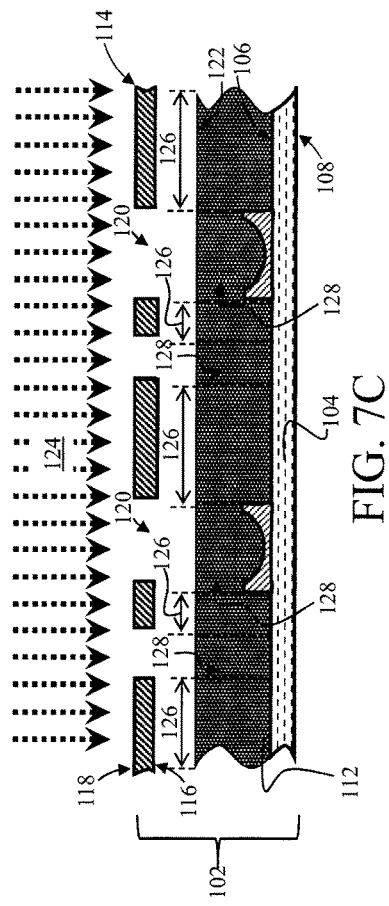
FIG. 7D
FIG. 7E
FIG. 7F

FIG. 8

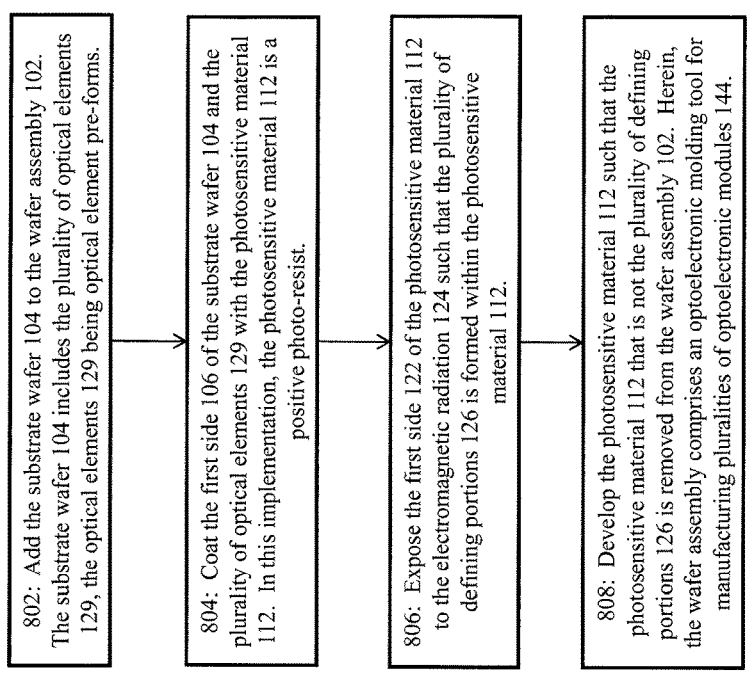

802: Add the substrate wafer 104 to the wafer assembly 102. The substrate wafer 104 includes the plurality of optical elements 129, the optical elements 129 being optical element pre-forms.

804: Coat the first side 106 of the substrate wafer 104 and the plurality of optical elements 129 with the photosensitive material 112. In this implementation, the photosensitive material 112 is a positive photo-resist.

806: Expose the first side 122 of the photosensitive material 112 to the electromagnetic radiation 124 such that the plurality of defining portions 126 is formed within the photosensitive material 112.

808: Develop the photosensitive material 112 such that the photosensitive material 112 that is not the plurality of defining portions 126 is removed from the wafer assembly 102. Herein, the wafer assembly comprises an optoelectronic molding tool for manufacturing pluralities of optoelectronic modules 144.

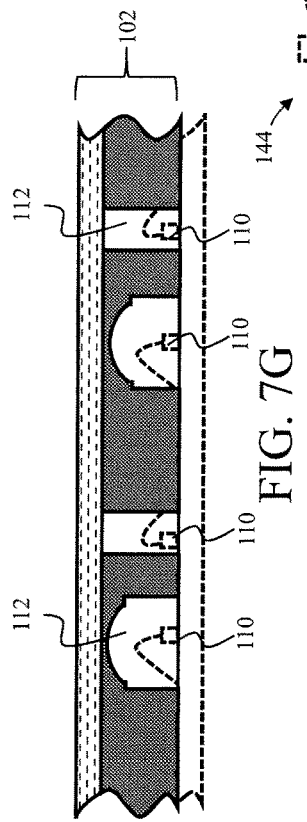

FIG. 7G

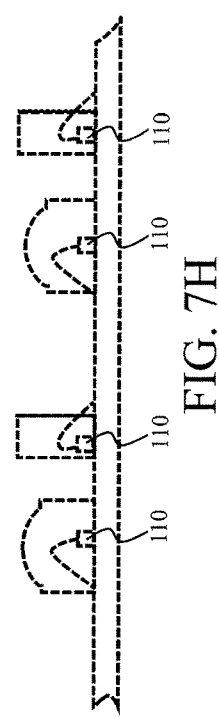

FIG. 7H

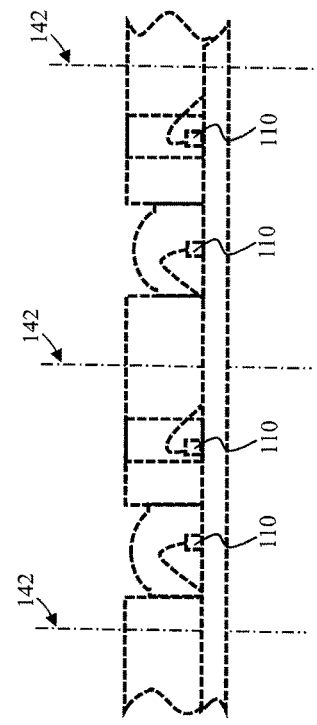

OPTOELECTRONIC MODULES AND OPTOELECTRONIC MOLDING TOOLS AND PROCESSES FOR MANUFACTURING THE SAME

FIELD OF THE DISCLOSURE

The present disclosure relates to optoelectronic modules and optoelectronic molding tools and methods for manufacturing such modules and tools.

BACKGROUND

State-of the-art wafer-level methods for manufacturing optoelectronic modules can have limitations. For example, injection molding or film assisted molding can be employed to manufacture modules effectively on a large scale (e.g., wafer level). However, the dimensions of such modules may be too large for some applications (e.g., as in portable, small-scale electronics). In such instances, the smallest dimensions that can be incorporated into the molding tools effectively dictate the smallest module dimensions achievable via these methods. Manufacturing processes are needed to incorporate finer dimensions into wafer-level processes and molding tools in order to produce modules with exceedingly small dimensions (e.g., 10s of microns).

SUMMARY

This disclosure describes optoelectronic modules, optoelectronic molding tools that employ, for example, photosensitive materials, and methods for manufacturing such optoelectronic modules and tools. The photosensitive materials can be exposed to electromagnetic radiation with a great deal of spatial precision. The exposed portions can define the dimensions of various components and features of which the optoelectronic modules are comprised. In one aspect, for example, a method for manufacturing a plurality of discrete optoelectronic modules includes:
  adding a substrate wafer to a wafer assembly, the substrate wafer including a plurality of optoelectronic components mounted to a first side of the substrate wafer;
  coating the first side of the substrate wafer and the plurality of optoelectronic components with a photosensitive material, the plurality of optoelectronic components being sensitive to and/or operable to emit electromagnetic radiation of a particular wavelength;
  exposing a first side of the photosensitive material to electromagnetic radiation such that a plurality of defining portions is formed within the photosensitive material, wherein each defining portion at least partially delineates dimensions of at least one optical channel associated with at least one of the optoelectronic components;
  developing the photosensitive material such that the photosensitive material that is not the plurality of defining portions is removed from the wafer assembly;
  mounting a back-fill wafer to the plurality of defining portions, the backfill wafer including a plurality of channels and defining a plurality of cavities adjacent to the plurality of defining portions;
  introducing a formable material into the back-fill wafer via the plurality of channels such that the formable material at least partially fills the plurality of cavities;
  curing the formable material such that the formable material within the plurality of cavities is substantially solid; and
  dicing the wafer assembly into the plurality of discrete optoelectronic modules.

In some implementations, the at least partially filled cavities are spacers, and the defining portions are optical channels. The spacers can be opaque to the particular wavelength of electromagnetic radiation, and the optical channels can be transparent to the particular wavelength of electromagnetic radiation.

In some implementations, the at least partially filled cavities are optical channels, and the defining portions are spacers. The optical channels can be transparent to the particular wavelength of electromagnetic radiation, and the spacers can be opaque to the particular wavelength of electromagnetic radiation.

In some implementations, the method further includes mounting a second side of the substrate wafer to a vacuum chuck. In some implementations, at least one optical channel includes an optical element. In some implementations, the method further includes exposing the wafer assembly to plasma.

In some implementations, exposing the first side of the photosensitive material includes selectively exposing the first side of the photosensitive material with electromagnetic radiation. In some instances, selectively exposing the first side of the photosensitive material with electromagnetic radiation includes exposing the first side through a plurality of mask holes within a mask that includes first and second sides. In some instances, the first side of the mask is in contact with the second side of the photosensitive material. In some instances, the plurality of mask holes includes a plurality of through-holes.

In some implementations, the method further includes:
  coating the first side of the photosensitive material with an additional layer of photosensitive material;
  exposing a first side of the additional layer of photosensitive material to electromagnetic radiation such that a plurality of additional defining portions is formed within the additional layer of photosensitive material, each additional defining portion delineating dimensions of an optical channel extension associated with at least one of the optical channels;
  developing the photosensitive material such that the photosensitive material that is not the plurality of additional defining portions is removed from the wafer assembly;
  mounting the back-fill wafer to the plurality of additional defining portions, the backfill wafer defining a plurality of cavity extensions adjacent to the plurality of additional defining portions;
  introducing a formable material into the back-fill wafer via the plurality of channels such that the formable material at least partially fills the plurality of cavity extensions; and
  curing the formable material such that the formable material within the plurality of cavity extensions is substantially solid.

In some implementations, the method includes heating the wafer assembly such that the formable material and/or the photo-sensitive material is substantially solid. In some implementations, introducing formable material includes applying a vacuum and/or elevated pressure to the channels. In some implementations, the method further includes mounting or depositing an additional photosensitive layer onto at least one of the spacers, and exposing a first side of the additional photosensitive layer to electromagnetic radiation.

In some implementations, the optoelectronic components include any one of, or any combination of, the following: laser diode, light-emitting diode, photodiode, charge-coupled device, complementary metal-oxide-semiconductor, and/or semiconductor chip including a photosensitive component.

In some implementations, the method includes coating the first side of the substrate wafer and the plurality of optoelectronic components with an optical filter layer, the optical filter layer being disposed between the substrate wafer and the photosensitive material.

In some instances, the method includes coating the first side of the substrate wafer and the plurality of optoelectronic components with a layer of resilient material, the layer of resilient material being disposed between the substrate wafer and the photosensitive material.

In some implementations, the method includes mounting at least one optical element on at least one of the plurality of optoelectronic components, the at least one optical element being disposed between the substrate wafer and the photosensitive material. In some instances, the at least one optical element can be formed by three-dimensional printing.

In some implementations, the method includes applying an aperture to at least one of the plurality of optical channels, the aperture being substantially opaque to the particular wavelength.

In another aspect, for example, a method for manufacturing an optoelectronic molding tool from a wafer assembly includes:
  adding a substrate wafer to the wafer assembly, the substrate wafer having first and second sides;
  mounting a plurality of optical elements to the first side of the substrate wafer, the plurality of optical elements being optical element preforms;
  coating the first side of the substrate wafer and the plurality of optical elements with a photosensitive material;
  exposing a first side of the photosensitive material to electromagnetic radiation such that a plurality of defining portions is formed within the photosensitive material, each defining portion at least partially delineating dimensions of at least one optical channel; and
  developing the photosensitive material such that the photosensitive material that is not the plurality of defining portions is removed from the wafer assembly.

In some implementations, the method for manufacturing the optoelectronic molding tool includes the at least one optical channel being an optical element.

In some implementations, exposing the first side of the photosensitive material includes selectively exposing the first side of the photosensitive material with electromagnetic radiation.

In some implementations, selectively exposing the first side of the photosensitive material with electromagnetic radiation includes exposing the first side through a plurality of mask holes within a mask.

Some of the implementations can provide for optoelectronic modules with particularly small dimensions and/or features. Other aspects, features and advantages will be readily apparent from the following detailed description, the accompanying drawings, and the claims.

BRIEF DESCRIPTION OF THE DRAWINGS

FIGS. 1A-1J depict an example sequence of steps for manufacturing a plurality of discrete optoelectronic modules.

FIGS. 3A-3L depict another example sequence of steps for manufacturing a plurality of discrete optoelectronic modules.

FIGS. 5A-5L depict yet another example sequence of steps for manufacturing a plurality of discrete optoelectronic modules.

FIGS. 7A-7E depict an example sequence of steps for manufacturing an optoelectronic molding tool.

FIGS. 7F-7J depict the manufacture of a plurality of optoelectronic modules using the optoelectronic molding tool depicted in FIG. 7E.

FIG. 8 is a flow chart illustrating the example sequence of steps for manufacturing the optoelectronic molding tool depicted in FIGS. 7A-7J.

DETAILED DESCRIPTION

Figure 2:
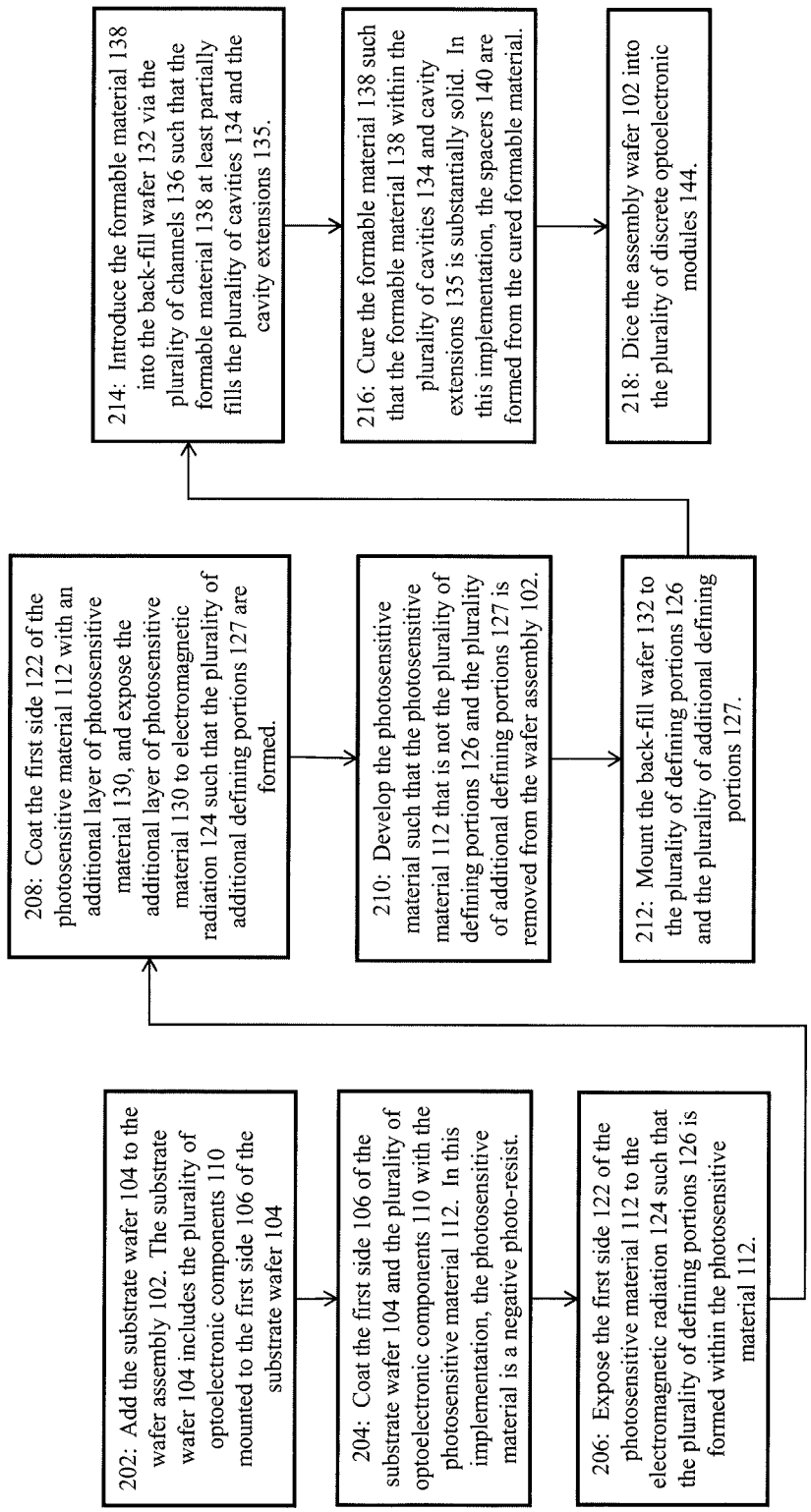
FIG. 2 is a flow chart illustrating the example sequence of steps for manufacturing a plurality of discrete optoelectronic modules depicted in FIGS. 1A-1J.

FIGS. 1A-1J depict an example sequence of steps for manufacturing a plurality of discrete optoelectronic modules. The optoelectronic modules can include any of a number of components that emit and/or are sensitive to light, and can be operable, for example, as structured-light generators, proximity sensors, ambient light sensors, three-dimensional or two-dimensional imaging cameras, or distance ranging apparatuses. Further, the optoelectronic modules can be manufactured with particularly small dimensions on the wafer-level (i.e., they can be cost-effectively manufactured by the 100s, 1000s or even 10,000s) with dimensions as small as 10s of microns.

FIG. 1A depicts a wafer assembly 102. The wafer assembly 102 includes a substrate wafer 104 (e.g., a printed circuit board). The substrate wafer 104 has a first side 106 and a second side 108. A plurality of optoelectronic components 110 are mounted onto the first side 106 of the substrate wafer 104. As mentioned above, the optoelectronic components 110 can include any one of, or any combination of, the following: a laser diode, a light-emitting diode, photodiode, a charge-coupled device, a complementary metal-oxide-semiconductor, and/or a semiconductor chip including a photosensitive component. The optoelectronic components 110 are sensitive to and/or operable to emit electromagnetic radiation of a particular wavelength (i.e., centered about a single wavelength or spanning a range of wavelengths). The optoelectronic components 110 can be mounted electrically (e.g., soldered or electrically bonded in some other way) and further can include heat-management components (e.g., heat-sinking compounds).

FIG. 1B depicts the wafer assembly 102 with a photosensitive material 112 coated onto the first side 106 of the substrate wafer 104 and the plurality of optoelectronic components 110. The photosensitive material 112 can be a photo-sensitive elastomeric material, such as a negative photo-resist as depicted, and can be applied to the substrate wafer 104 and the plurality of optoelectronic components 110, for example, via spin coating. Other state-of-the art methods for coating the substrate wafer 104 and the plurality of optoelectronic components 110 with a uniform coating of photosensitive material 112 can be used. Moreover, other photosensitive materials (e.g., as used in photolithography) can be used. For example, in some instances a positive photo-resist can be used, whereas in other instances a negative photo-resist can be used. In some instances, another layer can be coated onto the first side 106 of the substrate wafer 104 and the plurality of optoelectronic components 110 under the photosensitive material 112. For example, an optical filter film or a resilient material (e.g., silicone) can be coated onto the first side 106 of the substrate wafer material 104 and the plurality of optoelectronic components 110. The resilient material can minimize mechanical stresses in some instances. Further the resilient material can protect the optoelectronic components 110 during subsequent processing steps from damage from caustic or corrosive solvents, for example.

FIG. 1C depicts the wafer assembly 102 with a mask 114. The mask 114 includes a first side 116 and a second side 118. Further, the mask 114 includes holes 120. In some instances, the holes 120 are through-holes, whereas in other instances (as depicted in FIG. 1C) the holes 120 may take another form. In the latter instance, for example, the hole 120 may possess greater mechanical stability. In addition, photosensitive material 112 may be prevented from seeping into the mask holes 120. In some instances (as depicted in FIG. 1C), the mask 114 can be mounted on (e.g., in contact with and aligned to) a first side 122 of the photosensitive material 112. In other instances, however, the mask need not be in contact with the photosensitive material 112. The mask 114 can be composed, at least in part, of black chrome, steel, glass, aluminum or other materials operable to transmit electromagnetic radiation 124. Further, in instances where the first side 116 of the mask 114 is in contact with the first side 122 of the photosensitive material 112, the first side 116 of the mask 114 can have less affinity for the photosensitive material 112 than the first side 106 of the substrate wafer 104.

Upon mounting the mask 114 to the photosensitive material 112, the first side 122 of the photosensitive material 112 is exposed to electromagnetic radiation 124 (e.g., ultraviolet light). In some instances, the first side 122 can be exposed to electromagnetic radiation 124 without the mask 114. For example, the electromagnetic radiation 124 can be focused and strafed across the first side 122 of the photosensitive material 112. Upon exposing the photosensitive material 112 to electromagnetic radiation, defining portions 126 are formed. The defining portions 126 can coincide with the area exposed to electromagnetic radiation 124 in some instances (as depicted in FIG. 1C), whereas in other instances the defining portions 126 can coincide with the area that is not exposed to electromagnetic radiation 124. In either case, each defining portion 126 at least partially delineates at least one of the optical channels 128. Each optical channel 128 is associated with at least one optoelectronic component 110. In some instances, as depicted in FIG. 1C, each optical channel 128 corresponds to a defining portion 126, though this need not be the case as described for other implementations included within the present disclosure. Further, as depicted in FIG. 1C, an optical element 129 can be formed within the photosensitive material 112 (i.e., within one of the optical channels 128). The optical element 129 can include any of, or any combination of, a refractive lens, a diffractive lens, a microlens array, a diffuser, and/or an optical filter.

The aforementioned steps involving exposure of the photosensitive material 112 with electromagnetic radiation 124 can be repeated multiple times with the same mask 114 or other masks configured differently, and can be repeated with the same or different electromagnetic radiation 124 exposure conditions (e.g., intensity, wavelength). Repeating the aforementioned steps may be necessary in some instances, for example, when incorporating the optical elements 129 into the optical channels 128.

FIG. 1D depicts the wafer assembly 102 with an additional layer of photosensitive material 130. In some instances, optical channels 128 with different heights are desired. In such instances, the additional layer of photosensitive material 130 can be included in order to produce an optical channel extension 131 between the various optical channels 128 within the wafer assembly 102. The additional layer of photosensitive material 130 can be applied as described above. For example, the additional layer of photosensitive material 130 can be coated onto the first side 122 of the photosensitive material 112 by spin coating after the photosensitive material 112 is exposed to electromagnetic radiation 124 and the mask 114 is removed. The additional layer of photosensitive material 130 can be exposed to electromagnetic radiation 124, as described above; for example, an additional mask 115 (with first and second sides 117, 119) can be used, or the electromagnetic radiation 124 can be focused and strafed across the surface of the additional layer of the photosensitive material 130 as depicted in FIG. 1E. In either case, additional defining portions 127 result from the exposure, comparable to the defining portions 126.

FIG. 1F depicts the wafer assembly 102 after exposing the additional layer of photosensitive material 130 to electromagnetic radiation 124. Optical channels 128 include the optical channel extensions 131. In some instances, as depicted in FIGS. 1E and 1F, the additional defining portions 127 can coincide with the area exposed to electromagnetic radiation 124, whereas in other instances, the additional defining portions 127 can coincide with the area that is not exposed to electromagnetic radiation 124. In the former case, the additional defining portions 127 are cured by the electromagnetic radiation 124.

FIG. 1G depicts the wafer assembly 102 after developing. The photosensitive material 112 not exposed to electromagnetic radiation 124 is removed using appropriate developing solutions (e.g., photolithography developer) as would be apparent to a person of ordinary skill in the art. While the photosensitive material 112 not exposed to electromagnetic radiation 124 can be removed upon developing (as depicted in FIG. 1G), this need not always be the case. In some instances, photosensitive material that is exposed to electromagnetic radiation is later removed during a developing step as described for other implementations included within the present disclosure.

FIG. 1H depicts the wafer assembly 102 with a back-fill wafer 132. The back-fill wafer 132 together with the cured defining portions 126 and cured additional defining portions 127 form a plurality of cavities 134 and cavity extensions 135, respectively (the cavity extensions 135 correspond to the optical channel extensions 131 in the implementation depicted in FIG. 1H). In some instances, the back-fill wafer 132 include channels 136 and additional cavities, features, impressions, structuring, and so forth as depicted in FIG. 1H. The back-fill wafer 132 can be composed of a resilient material (e.g., silicone) or can be composed of a rigid material (e.g., etched glass, steel, aluminum). Formable material 138 is introduced into the back-fill wafer 132. In some instances, formable material 138 can be introduced into the back-fill wafer 132 via a vacuum, elevated pressure, or both. Formable material 138 at least partially fills the cavities 134 and cavity extensions 135. The formable material 138 can include fillers designed to influence the material's transmissivity, such as carbon black, and can further include fillers designed to influence the material's mechanical/structural properties, such as inorganic ceramics.

Upon at least partially filling the cavities 134 and cavity extensions 135, the formable material 138 then is cured (e.g., via electromagnetic radiation and/or thermal energy). In some instances, the cured formable material 138 forms a plurality of spacers 140 between the optical channels 128 (as depicted in FIG. 1I). In such instances, the formable material 138 is opaque to the particular wavelength. FIG. 1I further depicts dicing lines 142 along which the wafer assembly 102 is diced; consequently, the diced wafer assembly 102 is segmented into a plurality of discrete optoelectronic modules 144 as depicted in FIG. 1J.

FIG. 2 is a flow chart further illustrating an example sequence of steps for manufacturing the plurality of discrete optoelectronic modules depicted in FIGS. 1A-1J. At 202, the substrate wafer 104 is added to the wafer assembly 102. The substrate wafer 104 includes the plurality of optoelectronic components 110 mounted to the first side 106 of the substrate wafer 104. At 204, the first side 106 of the substrate wafer 104 and the plurality of optoelectronic components 110 are coated (e.g., spin-coated, sprayed) with the photosensitive material 112. As described above, the plurality of optoelectronic components 110 are sensitive to and/or operable to emit electromagnetic radiation of a particular wavelength.

At 206, the first side 122 of the photosensitive material 112 is exposed to the electromagnetic radiation 124 such that the plurality of defining portions 126 is formed within the photosensitive material 112. In this implementation, at least one of the defining portions 126 includes at least one of the optical elements 129. As mentioned above, each of the defining portions 126 at least partially delineates dimensions of at least one of the optical channels 128, and each of the optical channels 128 are associated with at least one of the optoelectronic components 110.

At 208, the first side 122 of the photosensitive material 112 is coated with an additional layer of photosensitive material 130. The additional layer of photosensitive material 130 is exposed to electromagnetic radiation 124 such that the plurality of additional defining portions 127 are formed as described in greater details above (see FIGS. 1D-1G, for example).

At 210, the photosensitive material 112 is developed such that the photosensitive material 112 that is not the plurality of defining portions 126 and the plurality of additional defining portions 127 is removed from the wafer assembly 102. At 212, the back-fill wafer 132 is mounted to the plurality of defining portions 126 and the plurality of additional defining portions 127. The backfill wafer 132 includes a plurality of channels 136 and the backfill wafer 132 defines, at least partially, the plurality of cavities 134 adjacent to the plurality of defining portions 126 and the cavity extensions 135 adjacent to the plurality of additional defining portions 127 as described in greater detail above (see FIG. 1H, for example).

A 214, the formable material 138 is introduced into the back-fill wafer 132 via the plurality of channels 136 such that the formable material 138 at least partially fills the plurality of cavities 134 and the cavity extensions 135. At 216, the formable material 138 is cured such that the formable material 138 within the plurality of cavities 134 and cavity extensions 135 is substantially solid. In this implementation, the spacers 140 are formed from the cured formable material. As described above, the spacers 140 are opaque to the particular wavelength of electromagnetic radiation, and the defining portions 126 and the additional defining portions 127 are optical channels 128. The optical channels 128 are transparent to the particular wavelength of electromagnetic radiation. Finally, at 218, the wafer assembly 102 is diced into the plurality of discrete optoelectronic modules 144. The steps described above can include other steps. For example, the wafer assembly 102 can be subject to oxygen plasma treatments between anyone of the aforementioned steps. Further, the wafer assembly 102 can be heat treated or various components can be washed with a solvent. Some implementations may include additional steps.

FIGS. 3A-3L depict another example sequence of steps for manufacturing a plurality of discrete optoelectronic modules. FIGS. 3A-3L depict the components and steps as described above with several modifications as described further below. FIG. 3A depicts the wafer assembly 102 with the plurality of optical elements 129 mounted to the first side 106 of the substrate wafer 104 prior to coating both with the photosensitive material 112. Each optical element within the plurality of optical element 129 is associated with at least one of the optoelectronic components 110. The plurality of optical elements 129 can be fabricated via any number of large-scale methods. For example, the optical elements 129 can be formed via three-dimensional printing, vacuum injection molding/injection molding and other methods of replication. The optical elements 129 may be composed, at least partially, of optical resins or other polymers. In some instances, the optical elements 129 can protect corresponding optoelectronic components 110 during subsequent processing steps. For example, the optical elements 129 can seal off optoelectronic components 110 from caustic or corrosive solvents used during subsequent developing steps. In some instances, the optical filter film and/or the resilient material, both described above, can be coated onto the first side 106 of the substrate wafer 104 prior to mounting the plurality of optical elements 129.

FIG. 3B depicts the wafer assembly 102 after the photosensitive material 112 is coated onto the first side 106 of the substrate wafer 104. FIGS. 3C and 3D depict alternate exposure steps. In FIG. 3C, the first side 122 of the photosensitive material 112 is exposed via the mask 114, whereas in FIG. 3D exposure is accomplished via focused electromagnetic radiation 124. Both steps are discussed in greater detail above. FIGS. 3E and 3G depict the photosensitive material 112 as a negative photo-resist as in FIGS. 1A-1J. However, while the defining portions 126 coincide with the optical channels in FIGS. 1A-1J and further illustrated in FIG. 2, the defining portions 126 in in this implementation coincide with the spacers 140 as illustrated in FIGS. 3E and 3F. Consequently, in FIG. 3G, the back-fill wafer 132 is in contact with the spacer 140. The formable material 138 is introduced into the cavities 134 via the channels 136. In this implementation, the cavities 134 coincide with the optical channels 128. The formable material 138, therefore, can be an optical resin or other polymeric material that, once cured, is transparent to the particular wavelength (i.e., the particular wavelength of electromagnetic radiation to which the optoelectronic components 110 are sensitive to and/or are operable to emit).

FIG. 3I depicts an alternative implementation of the additional photosensitive layer 130. In this implementation, the additional photosensitive layer 130 can be deposited or mounted onto the plurality of spacers 140 via screen printing or other deposition techniques. The additional photosensitive layer 130 is then exposed to electromagnetic radiation 124 as depicted in FIG. 3J. In some instances, the additional photosensitive layer 130 can be exposed to thermal energy (e.g., infrared radiation). In some instances, the additional photosensitive layer 130 can be exposed to ultraviolet radiation. The additional photosensitive layer 130 can have any number of functions. In FIG. 3L, the additional photosensitive layer 130 is used as a spacer or bumper in direct contact with a host device 146 (e.g., a smartphone, laptop, tablet computer). The spacer can enable precise placement of the discrete optoelectronic modules 144 relative to the host device 146, and in some instances, can provide mechanical advantages (e.g., for mounting or dampening vibrations or mechanical shock). In some instances, the additional photosensitive layer 130 can act as a baffle (i.e., limiting or at least partially affecting the amount of light incident on or emitted from a corresponding optoelectronic component 110).

Figure 4:
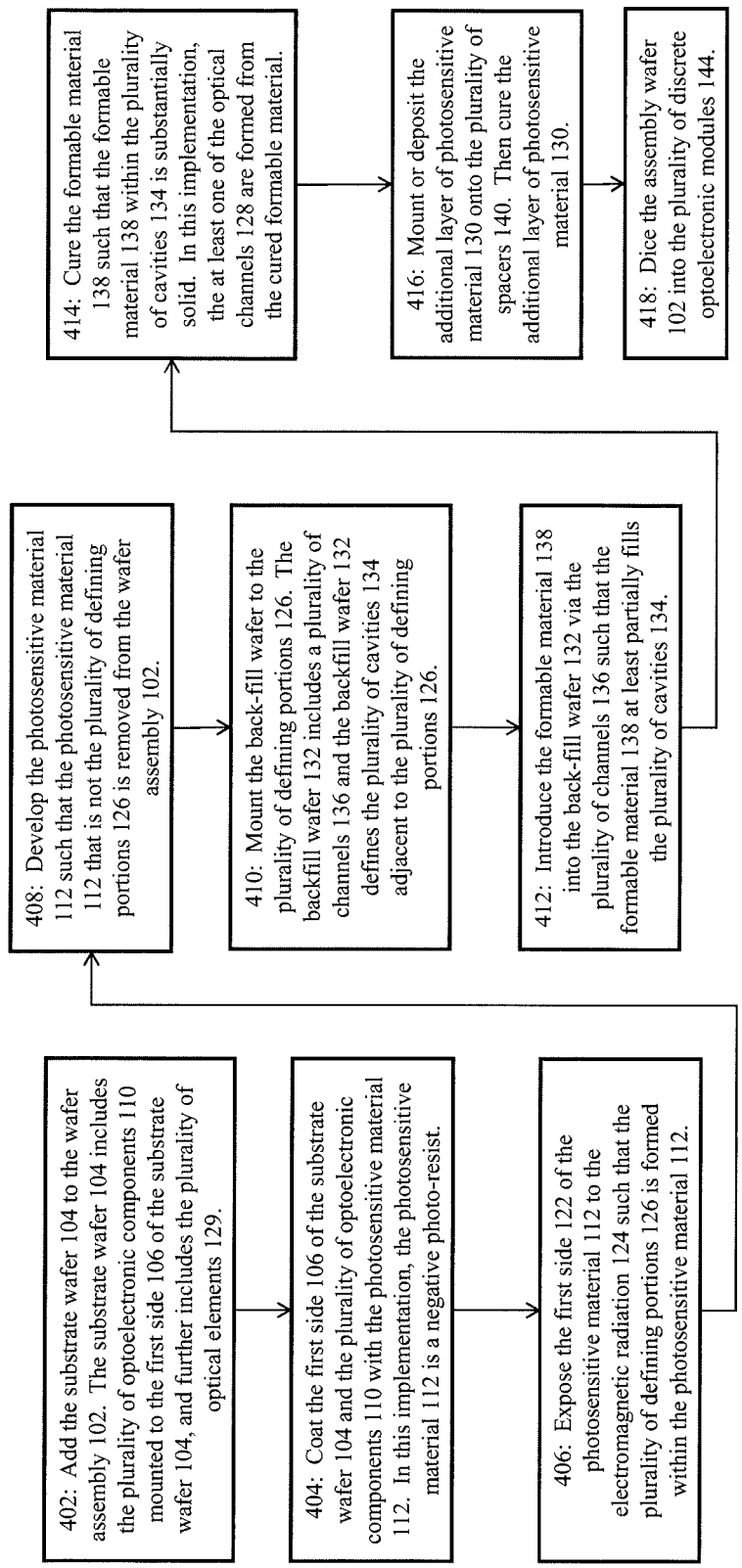
FIG. 4 is a flow chart illustrating the example sequence of steps for manufacturing a plurality of discrete optoelectronic modules depicted in FIGS. 3A-3L.
Figure 5A:
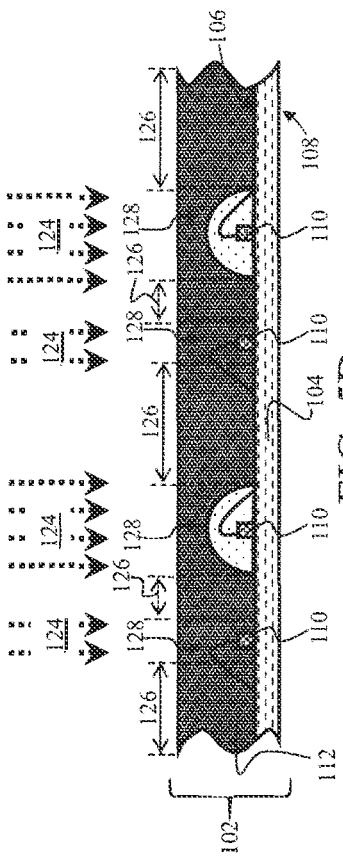
Figure 5B:
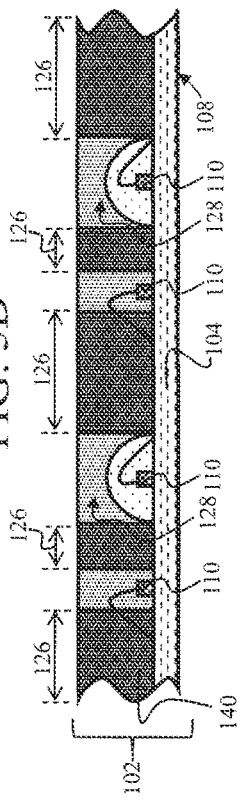
Figure 5C:
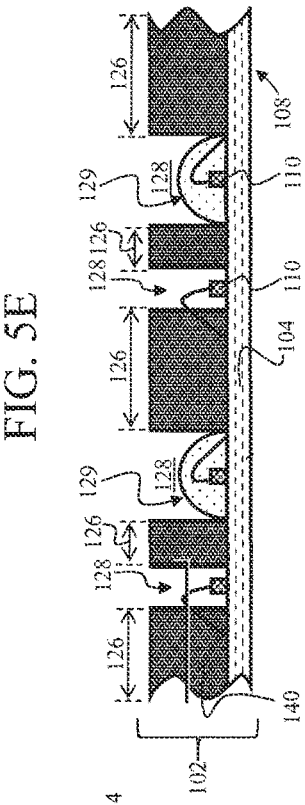
Figure 5D:
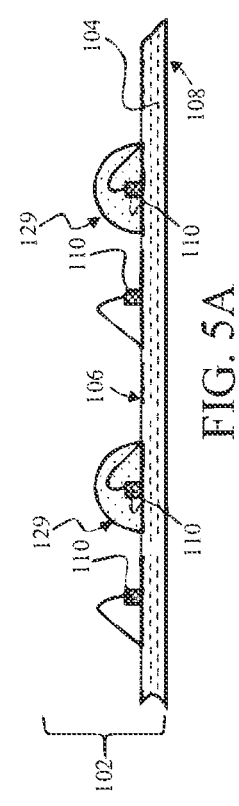
Figure 5E:
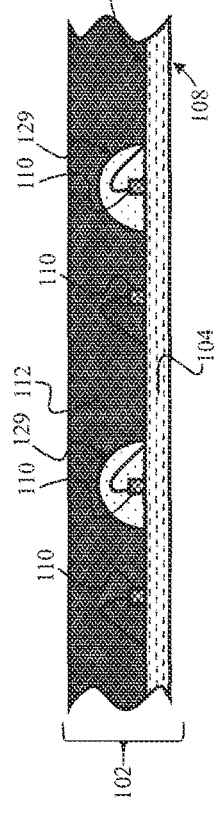
Figure 5F:
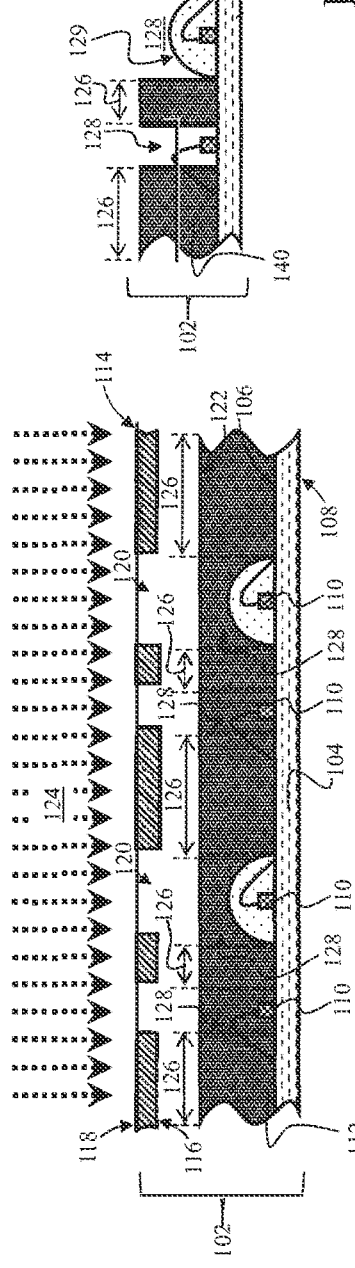

FIG. 4 is a flow chart further illustrating an example sequence of steps for manufacturing the plurality of discrete optoelectronic modules depicted in FIGS. 3A-3L. At 402, the substrate wafer 104 is added to the wafer assembly 102. The substrate wafer 104 includes the plurality of optoelectronic components 110 mounted to the first side 106 of the substrate wafer 104, and further includes the plurality of optical elements 129, described above. At 404, the first side 106 of the substrate wafer 104 and the plurality of optoelectronic components 110 are coated (e.g., spin-coated, sprayed) with the photosensitive material 112. In this implementation, the photosensitive material 112 is a negative photo-resist.

At 406, the first side 122 of the photosensitive material 112 is exposed to the electromagnetic radiation 124 such that the plurality of defining portions 126 is formed within the photosensitive material 112. As mentioned above, each of the defining portions 126 at least partially delineates dimensions of at least one of the optical channels 128, and each of the optical channels 128 is associated with at least one of the optoelectronic components 110.

At 408, the photosensitive material 112 is developed such that the photosensitive material 112 that is not the plurality of defining portions 126 is removed from the wafer assembly 102. At 410, the back-fill wafer 132 is mounted to the plurality of defining portions 126. The backfill wafer 132 includes a plurality of channels 136 and the backfill wafer 132 defines, at least partially, the plurality of cavities 134 adjacent to the plurality of defining portions 126, as described in greater detail above (see FIG. 3E, for example).

At 412, the formable material 138 is introduced into the back-fill wafer 132 via the plurality of channels 136 such that the formable material 138 at least partially fills the plurality of cavities 134. At 414, the formable material 138 is cured such that the formable material 138 within the plurality of cavities 134 is substantially solid. In this implementation, the at least one of the optical channels 128 are formed from the cured formable material. As described above, the spacers 140 are opaque to the particular wavelength of electromagnetic radiation, and the defining portions 126 coincide with the spacers 140. The optical channels 128 are transparent to the particular wavelength of electromagnetic radiation.

At 416, the additional layer of photosensitive material 130 is mounted or deposited onto the plurality of spacers 140. The additional layer of photosensitive material 130 is then cured. At 418, the wafer assembly 102 is diced into the plurality of discrete optoelectronic modules 144. As mentioned previously, the foregoing process can include other steps as well. For example, the wafer assembly 102 can be subject to oxygen plasma treatments between anyone of the aforementioned steps. Further, the wafer assembly 102 can be heat treated or various components can be washed with a solvent.

FIGS. 5A-5L depict another example sequence of steps for manufacturing a plurality of discrete optoelectronic modules. FIGS. 5A-5L depict the components and steps as described above, except that the photosensitive material 112 is a positive photo-resist in this implementation. The plurality of defining portions 126 coincide with the plurality of spacers 140 and delineate, at least partially, dimensions of the plurality of optical channels 128 as described in detail above.

Figure 6:
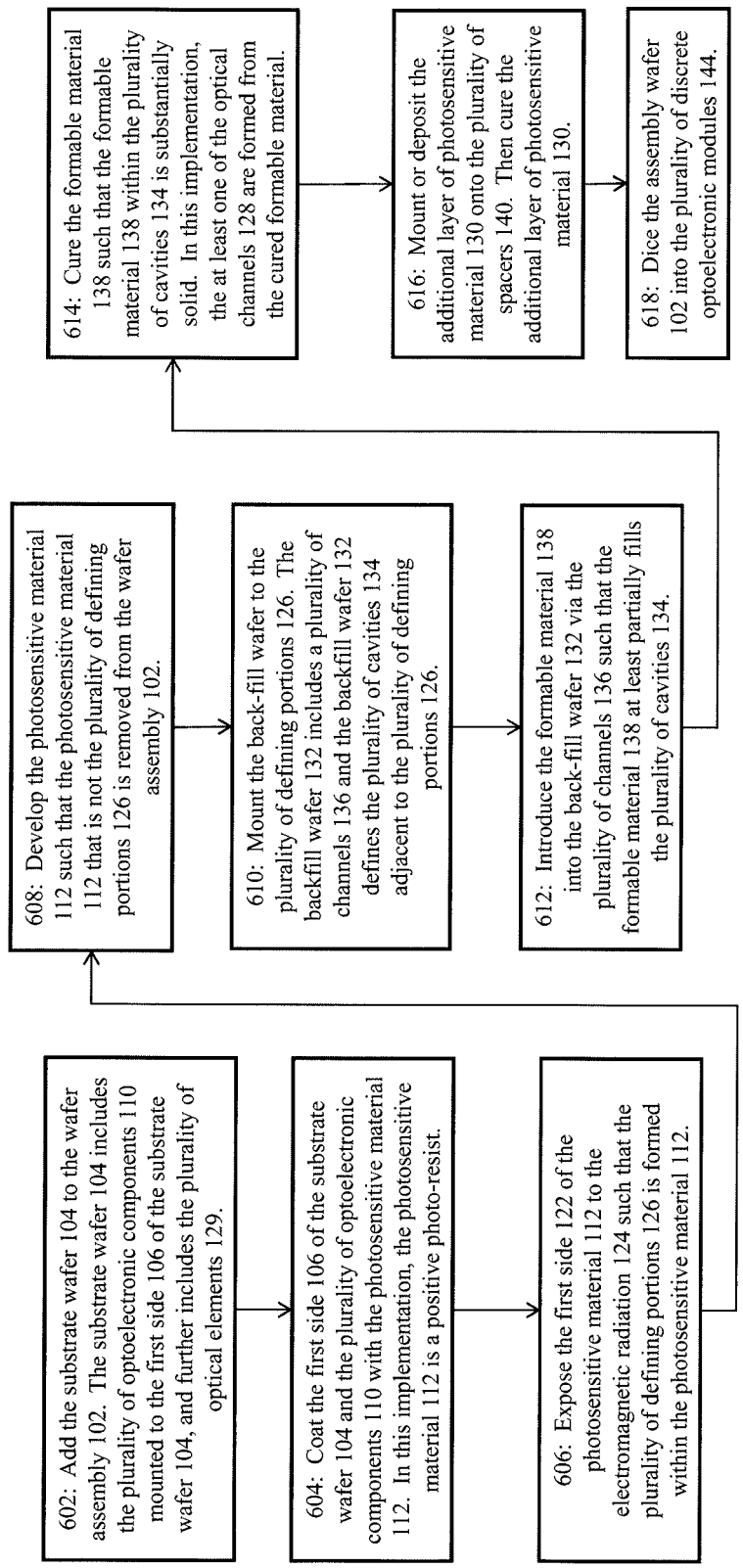
FIG. 6 is a flow chart illustrating the example sequence of steps for manufacturing a plurality of discrete optoelectronic modules depicted in FIGS. 5A-5L.

FIG. 6 is a flow chart further illustrating an example sequence of steps for manufacturing the plurality of discrete optoelectronic modules depicted in FIGS. 5A-5L. At 602, the substrate wafer 104 is added to the wafer assembly 102. The substrate wafer 104 includes the plurality of optoelectronic components 110 mounted to the first side 106 of the substrate wafer 104, and further includes the plurality of optical elements 129, described above. At 604, the first side 106 of the substrate wafer 104 and the plurality of optoelectronic components 110 are coated (e.g., spin-coated, sprayed) with the photosensitive material 112. In this implementation, the photosensitive material 112 is a positive photo-resist.

At 606, the first side 122 of the photosensitive material 112 is exposed to the electromagnetic radiation 124 such that the plurality of defining portions 126 is formed within the photosensitive material 112. As mentioned above, each of the defining portions 126 delineate, at least partially, dimensions of one of the corresponding optical channels 128, and each of the optical channels 128 are associated with at least one of the optoelectronic components 110.

At 608, the photosensitive material 112 is developed such that the photosensitive material 112 that is not the plurality of defining portions 126 is removed from the wafer assembly 102. At 610, the back-fill wafer 132 is mounted to the plurality of defining portions 126. The backfill wafer 132 includes a plurality of channels 136 and the backfill wafer 132 defines, at least in part, the plurality of cavities 134 adjacent to the plurality of defining portions 126, as described in greater detail above (see FIG. 5E, for example).

At 612, the formable material 138 is introduced into the back-fill wafer 132 via the plurality of channels 136 such that the formable material 138 at least partially fills the plurality of cavities 134. At 614, the formable material 138 is cured such that the formable material 138 within the plurality of cavities 134 is substantially solid. In this implementation, the at least one of the optical channels 128 are formed from the cured formable material. As described above, the spacers 140 are opaque to the particular wavelength of electromagnetic radiation, and the defining portions 126 coincide with the spacers 140. The optical channels 128 are transparent to the particular wavelength of electromagnetic radiation.

At 616, the additional layer of photosensitive material 130 is mounted or deposited onto the plurality of spacers 140. The additional layer of photosensitive material 130 is then cured. At 618, the wafer assembly 102 is diced into the plurality of discrete optoelectronic modules 144. As mentioned previously, the steps described above can include other steps as well. For example, the wafer assembly 102 can be subject to oxygen plasma treatments between anyone of the aforementioned steps. Further, the wafer assembly 102 can be heat treated or various components can be washed with a solvent.

FIGS. 7A-7E depict an example sequence of steps for manufacturing an optoelectronic molding tool. The steps are as described above, except that the optoelectronic molding tool comprises the wafer assembly 102 upon completion of the developing step depicted in FIG. 7E. Further, the optical element 129, in this example, is an optical element pre-form fabricated by any known technique (e.g., replication). All other components depicted can be as described above. The optoelectronic molding tool comprising the wafer assembly 102 is subsequently used to manufacture a plurality of optoelectronic modules 144 as depicted in FIGS. 7F-7J.

FIG. 8 is a flow chart further illustrating an example sequence of steps for manufacturing the optoelectronic molding tool as depicted in FIGS. 7A-7E. At 802, the substrate wafer 104 is added to the wafer assembly 102. The substrate wafer 104 includes the plurality of optical elements 129, the optical elements 129 being optical element pre-forms. At 804, the first side 106 of the substrate wafer 104 and the plurality of optical elements 129 are coated with the photosensitive material 112. In this implementation, the photosensitive material 112 is a positive photo-resist. At 806, the first side 122 of the photosensitive material 112 is exposed to the electromagnetic radiation 124 such that the plurality of defining portions 126 is formed within the photosensitive material 112. At 808, the photosensitive material 112 is developed such that the photosensitive material 112 that is not the plurality of defining portions 126 is removed from the wafer assembly 102. Herein, the wafer assembly 102 comprises an optoelectronic molding tool for manufacturing pluralities of optoelectronic modules 144 as depicted in FIGS. 7F-7J. As mentioned previously, the steps described above can include other steps as well. For example, the wafer assembly 102 can be subject to oxygen plasma treatments between or during anyone of the aforementioned steps. Further, the wafer assembly 102 can be heat treated or various components can be washed with a solvent.

The aforementioned examples and implementations describe sequences of steps for manufacturing pluralities of discrete optoelectronic modules. Various steps are described sequentially, though steps need not occur in the sequence(s) described. Moreover, in some instances, steps described sequentially may be carried out simultaneously. Further, the example steps described above can be repeated in some instances. Still, other modifications may be made to the foregoing implementations; for example, some of the foregoing implementations can include an aperture (e.g., at least partially composed of black chrome) mounted or deposited on some of the optical channels 128 (e.g., via photolithographic techniques, screen printing, and so forth). Further, steps involving the application of a releasing agent can be performed in any of the aforementioned implementations. Still further, features described above in different implementations may be combined in the same implementations. Thus, other implementations are within the scope of the claims.

What is claimed is:

1. A method for manufacturing a plurality of discrete optoelectronic modules from a wafer assembly, the method comprising:
adding a substrate wafer to the wafer assembly, the substrate wafer including a plurality of optoelectronic components mounted to a first side of the substrate wafer;
coating the first side of the substrate wafer and the plurality of optoelectronic components with a photosensitive material, the plurality of optoelectronic components being sensitive to and/or operable to emit electromagnetic radiation of a particular wavelength;
exposing a first side of the photosensitive material to electromagnetic radiation such that a plurality of defining portions is formed within the photosensitive material, each defining portion at least partially delineating dimensions of at least one optical channel associated with at least one of the optoelectronic components;
developing the photosensitive material such that the photosensitive material that is not the plurality of defining portions is removed from the wafer assembly;
mounting a back-fill wafer to the plurality of defining portions, the backfill wafer including a plurality of channels and defining, at least partially, a plurality of cavities adjacent to the plurality of defining portions;
introducing a formable material into the back-fill wafer via the plurality of channels such that the formable material at least partially fills the plurality of cavities;
curing the formable material such that the formable material within the plurality of cavities is substantially solid; and
dicing the wafer assembly into the plurality of discrete optoelectronic modules.

2. The method for manufacturing the plurality of discrete optoelectronic modules of claim 1 wherein the at least partially filled cavities are spacers, the spacers being opaque to the particular wavelength of electromagnetic radiation, and the defining portions are optical channels, the optical channels being transparent to the particular wavelength of electromagnetic radiation.

3. The method for manufacturing the plurality of discrete optoelectronic modules of claim 1 wherein the at least partially filled cavities are optical channels, the optical channels being transparent to the particular wavelength of electromagnetic radiation, and the defining portions are spacers, the spacers being opaque to the particular wavelength of electromagnetic radiation.

4. The method for manufacturing the plurality of discrete optoelectronic modules of claim 1 further including mounting a second side of the substrate wafer to a vacuum chuck.

5. The method for manufacturing the plurality of discrete optoelectronic modules of claim 1 wherein at least one optical channel includes an optical element.

6. The method for manufacturing the plurality of discrete optoelectronic modules of claim 1 further including exposing the wafer assembly to plasma.

7. The method for manufacturing the plurality of discrete optoelectronic modules of claim 1 wherein exposing the first side of the photosensitive material includes selectively exposing the first side of the photosensitive material with electromagnetic radiation.

8. The method of claim 7, wherein selectively exposing the first side of the photosensitive material with electromagnetic radiation includes exposing the first side through a plurality of mask holes within a mask.

9. The method of claim 8, wherein the mask includes first and second sides, and the first side of the mask is in contact with the first side of the photosensitive material.

10. The method of claim 8, wherein the plurality of mask holes includes a plurality of through-holes.

11. The method of claim 1 further including:
coating the first side of the photosensitive material with an additional layer of photosensitive material;
exposing a first side of the additional layer of photosensitive material to electromagnetic radiation such that a plurality of additional defining portions is formed within the additional layer of photosensitive material, each additional defining portion delineating, at least in part, dimensions of at least one optical channel extension associated with at least one of the optical channels;

developing the photosensitive material such that the photosensitive material that is not the plurality of additional defining portions is removed from the wafer assembly;

mounting the back-fill wafer to the plurality of additional defining portions, the backfill wafer defining, at least partially, a plurality of cavity extensions adjacent to the plurality of additional defining portions;

introducing a formable material into the back-fill wafer via the plurality of channels such that the formable material at least partially fills the plurality of cavity extensions; and curing the formable material such that the formable material within the plurality of cavity extensions is substantially solid.

12. The method of claim 1, further including mounting or depositing an additional photosensitive layer onto at least one of the spacers, and exposing a first side of the additional photosensitive layer to electromagnetic radiation.

13. The method of claim 1, further including coating the first side of the substrate wafer and the plurality of optoelectronic components with a layer of resilient material, the layer of resilient material being disposed between the substrate wafer and optoelectronic components, and the photosensitive material.

* * * * *